(12) United States Patent
Bains, II

(10) Patent No.: US 6,804,676 B1
(45) Date of Patent: Oct. 12, 2004

(54) SYSTEM AND METHOD IN A DATA PROCESSING SYSTEM FOR GENERATING COMPRESSED AFFINITY RECORDS FROM DATA RECORDS

(75) Inventor: Richard Bains, II, Rushford, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/386,659

(22) Filed: Aug. 31, 1999

(51) Int. Cl.$^7$ .............................................. G06F 17/30
(52) U.S. Cl. ................... 707/101; 707/102; 707/103; 707/104; 707/203
(58) Field of Search .................................. 707/1, 2, 100, 707/101, 203, 102, 103, 104; 341/50

(56) References Cited

U.S. PATENT DOCUMENTS

| | | | | |
|---|---|---|---|---|
| 5,298,992 A | | 3/1994 | Pietras et al. ............... | 348/415 |
| 5,574,906 A | * | 11/1996 | Morris ........................... | 707/1 |
| 5,666,114 A | * | 9/1997 | Brodie et al. .................. | 341/50 |
| 5,745,898 A | * | 4/1998 | Burrows ....................... | 707/101 |
| 5,799,308 A | * | 8/1998 | Dixon ........................... | 707/100 |
| 5,826,253 A | * | 10/1998 | Bredenberg .................... | 707/2 |
| 5,873,097 A | * | 2/1999 | Harris et al. ................. | 707/203 |
| 5,999,936 A | * | 12/1999 | Pattison ....................... | 707/101 |

* cited by examiner

*Primary Examiner*—Thuy N. Pardo
(74) *Attorney, Agent, or Firm*—Dillon & Yudell, LLP; Roy W. Truelson

(57) ABSTRACT

A system and method for generating compressed affinity records obtains first and second data records, generates zero or more length values representing portions of the second data record that agree with corresponding portions of the first data record, generates zero or more delta values representing portions of the second data record that differ from corresponding portions of the first data record, and combines those length and delta values to form a compressed affinity record. In an illustrative embodiment, the length and delta values are generated by exclusive ORing first and second journal records, and the compressed affinity record can be utilized to maintain mirrored data files.

12 Claims, 11 Drawing Sheets

US 6,804,676 B1

SYSTEM AND METHOD IN A DATA PROCESSING SYSTEM FOR GENERATING COMPRESSED AFFINITY RECORDS FROM DATA RECORDS

BACKGROUND OF THE INVENTION

1. Technical Field

The present invention relates in general to data processing and in particular to data compression. Still more particularly, the present invention relates to systems and methods for generating compressed affinity records from data records.

2. Description of the Related Art

Currently, data processing systems are widely utilized to process and store mission-critical data. A risk always exists, however, that such data may become inaccessible. For example, if data are stored exclusively as in a disk drive of a data processing system, and that disk drive experiences a hardware failure, the data may be lost or, at least, will not be accessible until the disk drive is repaired. In order to provide greater assurance that access to data will not be unduly interrupted, a technique known as mirroring is often utilized.

In a typical mirrored environment, each file in a primary data processing system that is to be mirrored is copied to a secondary data processing system, which is typically situated at a remote location relative to the primary (or on-site) data processing system. Then, as data in the duplicated files are modified in the primary data processing system, journal entries describing those modifications are transmitted to the secondary data processing system. Those journal entries are utilized by the secondary data processing system to keep the remote data consistent with the on-site data. The journal entries are typically composed of header and body portions, with the header containing transaction-specific information (such as the name of the file containing the data that was updated and the time that the update occurred) and the body containing a complete image of the modified data record, as stored in the system after the modification (i.e., a complete after-image of the record).

Conventional mirroring techniques thus provide a dependable secondary data repository. One of the main disadvantages associated with such mirroring techniques, however, is that they require substantial bandwidth when they are utilized to mirror files that contain large records or files that are frequently updated. The present invention recognizes that the bandwidth requirements would be substantially reduced if the journal records were compressed before they were transmitted. The present invention also recognizes that contexts other than mirroring involve data records that can be compressed based on record sequence to reduce storage and bandwidth requirements.

SUMMARY OF THE INVENTION

To address these shortcomings, the present invention introduces a method, system, and program product that obtains first and second data records, generates zero or more length values representing portions of the second data record that agree with corresponding portions of the first data record, generates zero or more delta values representing portions of the second data record that differ from corresponding portions of the first data record, and combines those length and delta values to form a compressed affinity record.

In an illustrative embodiment, the length and delta values are generated by exclusive ORing first and second journal records, and the compressed affinity record can be utilized to maintain mirrored data files.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
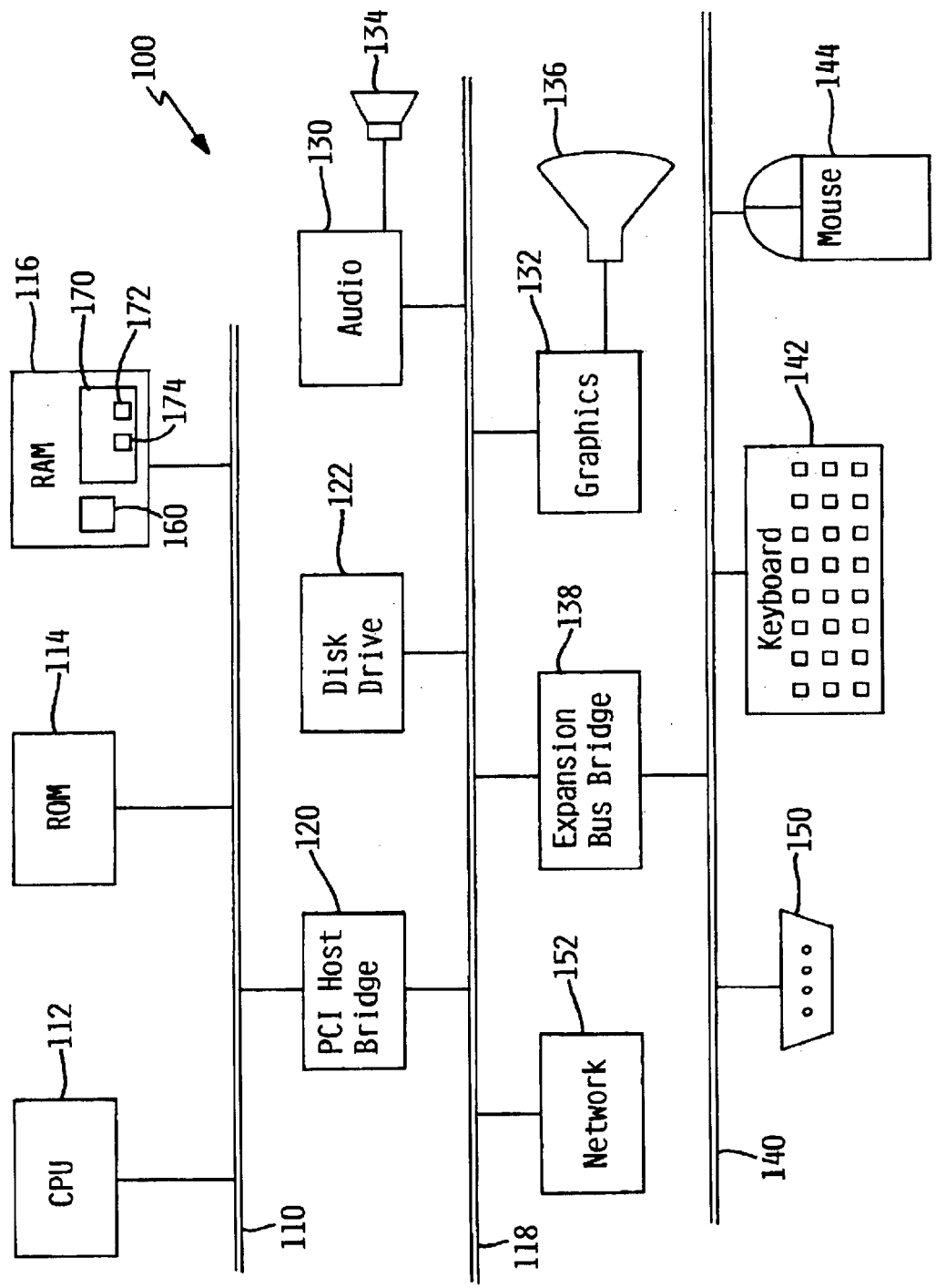
FIG. 1 depicts a block diagram of an illustrative embodiment of a data processing system with facilities for generating compressed affinity records according to the present invention.

With reference now to the figures, and in particular with reference to FIG. 1, there is depicted an illustrative embodiment of a data processing system 100 with facilities for generating compressed affinity records according to the present invention. Data processing system 100, which may comprise a personal computer, for example, includes a system bus 110 that is connected to a central processing unit (CPU) 112 and to memory, including read only memory (ROM) 114 and random access memory (RAM) 116. CPU 112 and the memory are also coupled to a PCI local bus 118 of data processing system 100 through a PCI host bridge 120. PCI local bus 118 is also connected to additional nonvolatile data storage devices, such as one or more disk drives 122, and to an audio adapter 130 and a graphics adapter 132 for controlling audio output through a speaker 134 and visual output through a display device 136, respectively. A PCI-to-ISA bus bridge, such as expansion bus bridge 138, connects PCI local bus 118 to an ISA bus 140, which is attached (through appropriate adapters) to a keyboard 142 and a mouse 144 for receiving operator input.

Data processing system 100 also includes one or more data ports for communicating with a remote data processing systems. The data port(s) may include, without limitation, a serial port 150 attached to ISA bus 140 for linking data processing system 110 to a remote data processing system (not illustrated) via a modem (not illustrated) and/or a communications adapter 152 attached to PCI bus 118 for connecting workstation 112 to local area network (LAN) 116.

Data processing system 100 also contains software programs that are stored on the data storage devices and loaded into RAM 116 and then into CPU 112 for execution. Among those programs are a database engine 160 that generates journal records describing modifications to data in data processing system 100 and a mirror engine 170 that receives those journal records, compresses them, and transmits them to the remote data processing system. Included in (or in communication with) mirror engine 170 are a compressed-affinity-record generator 172 and an output facility 174 for facilitating those compression and transmission functions.

Figure 2:
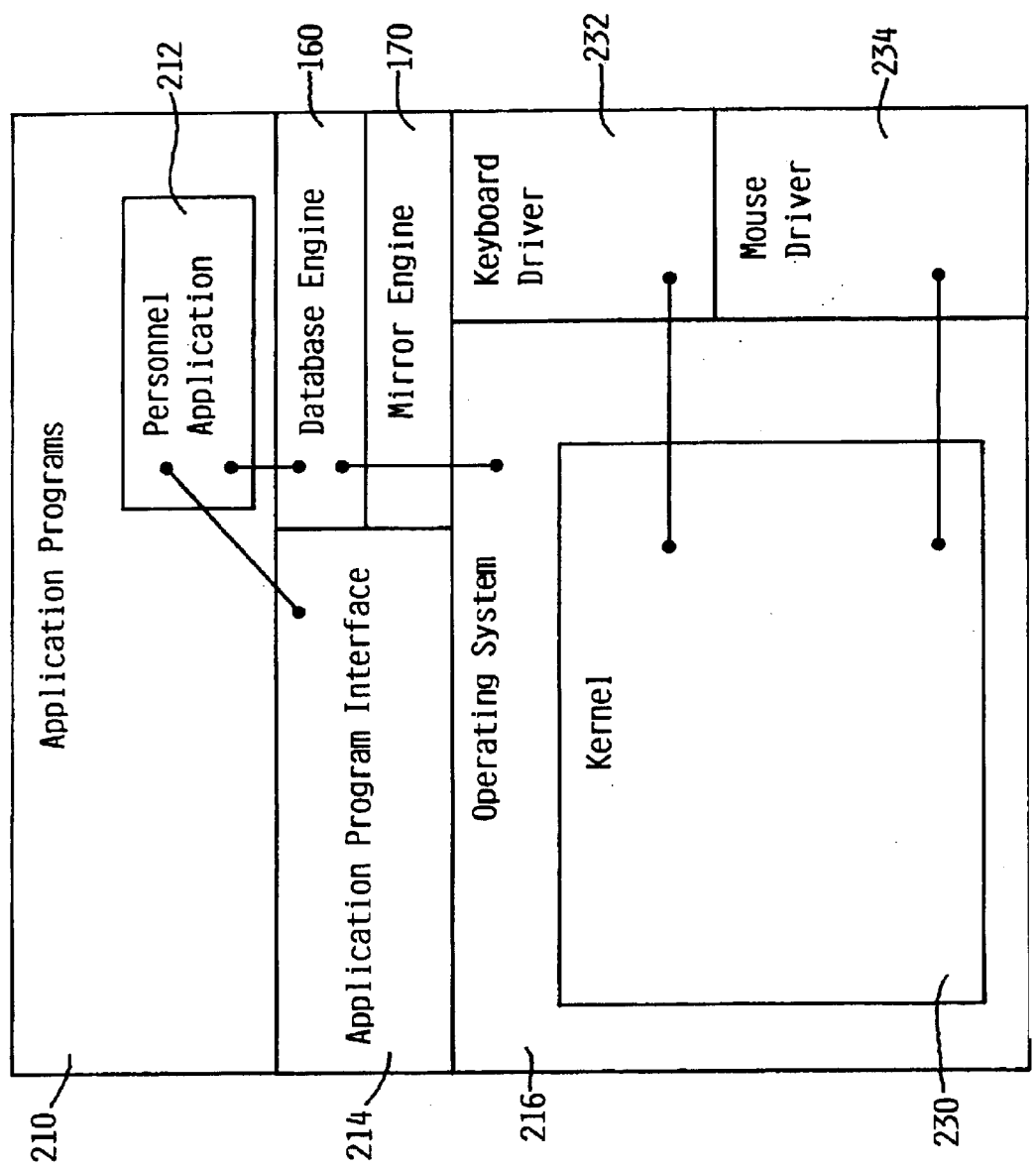
FIG. 2 is a layer diagram of the programs in the data processing system of FIG. 1 that cooperate to generate compressed affinity records according to the present invention.

Referring now to FIG. 2, there is depicted a layer diagram of exemplary software in data processing system 100 that cooperates to provide the functionality of the present invention. At the highest level of the diagram are the application programs 210, including a personnel application 212 for maintaining personnel records.

At the intermediate level is an application program interface (API) 214, through which application programs 210 request services from the operating system 216. The intermediate level also includes database engine 160, which provides application programs 210 with enhanced file manipulation capabilities, including the ability to automatically generate journal records that document changes to information stored in data processing system 100. When such journal entries are generated, database engine 160 sends them to mirror engine 170, which also resides at the intermediate level. As described in greater detail above and below, mirror engine 170 processes and forwards those journal entries to a secondary data repository, via operating system 214, where the modifications are replicated to provide a secondary repository for the current data.

Operating system 216, which occupies the lowest level of the diagram, manages the operations of data processing system 100 by performing duties such as resource allocation, task management, and error detection. Included in operating system 216 is a kernel 230 that manages the memory, files, and peripheral devices of data processing system 100. The lowest level also includes device drivers, such as a keyboard driver 232 and a mouse driver 234, that kernel 230 utilizes to manage input from and output to peripheral devices.

Figure 3:
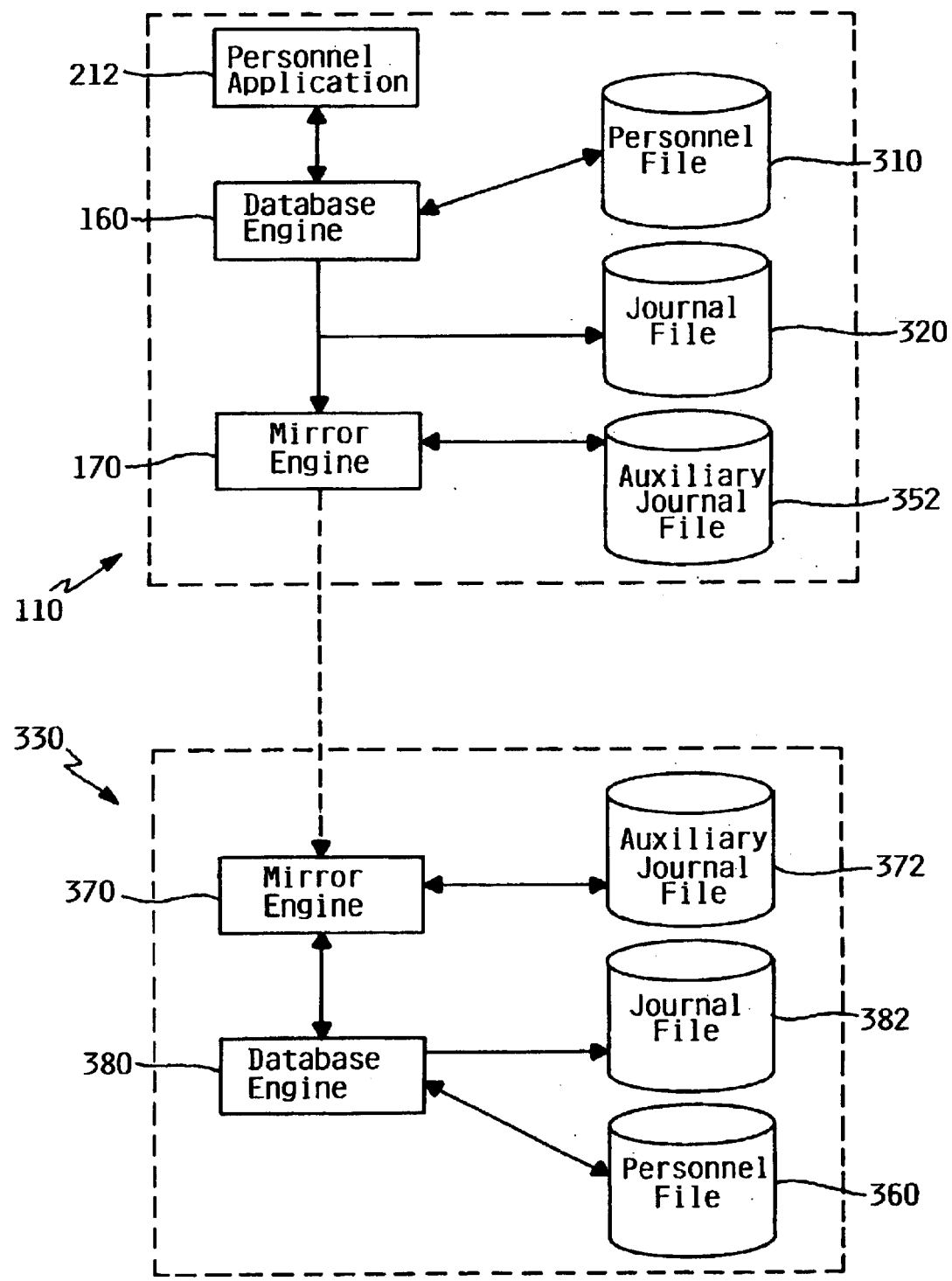
FIG. 3 illustrates an exemplary file mirroring system including facilities for generating and utilizing compressed affinity records according to the present invention.

With reference now to FIG. 3, the illustrative embodiment will be described in terms of an operational context in which an operator of data processing system 100 (i.e., the primary or local system) is utilizing personnel application 212 to maintain a personnel file (or table) 310 stored locally in data processing system 100. Personnel 20 file 310 is named "Personnel" and is stored in a library named "DemoLib." A mirror image of personnel file 310 (i.e., remote personnel file 360) is being maintained at remote data processing system 330. Although, as explained below, particular embodiments of the present invention may be implemented in a wide range of data processing system hardware and software configurations, in the illustrative embodiment the hardware and software of remote data processing system 330 are substantially similar to those of data processing system 100.

Personnel application 212 modifies personnel file 310 through database engine 160, which could be a DB2™ or Oracle™ database engine, for example. Whenever personnel application 212 modifies personnel file 310 (i.e., adds a new record to that file, changes an existing record in that file, or deletes an existing record from that file), database engine 160 generates a journal record describing the modification and stores that journal record in a local journal file (or table) 320.

In accordance with the present invention, the journal record is also sent to a mirror engine 170, which utilizes compressed-affinity-record generator 172 to generate and compress a current affinity record based on the journal record. As described in detail below, compressed-affinity-record generator 172 produces the affinity record by comparing the current journal record with the previous journal record for personnel file 310, which is retrieved from a local auxiliary journal file (or table) 352. Mirror engine 170 then replaces the previous journal record in local auxiliary journal file 352 with the current journal record and, utilizing output facility 174, transmits the current affinity record to remote data processing system 330, thereby initiating an update to remote personnel file 360.

The affinity record is received at remote data processing system 330 by a remote mirror engine 370. As described in detail below, remote mirror engine 370 then retrieves the previous journal record for remote personnel file 360 from remote auxiliary journal table 372 and utilizes that journal record and the current affinity record to reconstitute the current journal record. The current journal record is then converted into an update request, and that update request is sent to a remote database engine 380, which responds by modifying remote personnel file 360, thereby bringing that file into agreement with local personnel file 310. Remote mirror engine 370 then replaces the previous journal record in remote auxiliary journal file 372 with the current journal record. In addition, if local journal file 320 is also being mirrored, the current journal record is added to a remote journal file 382.

An exemplary process, in accordance with the present invention, for generating and transmitting compressed affinity records in response to the receipt of journal entries will now be described with reference to the flowchart of FIG. 4. For illustrative purposes the process shown in FIG. 4, as well as those shown in FIGS. 5, 6, and 7 will be described in terms of local data processing system 100 and remote data processing system 330. Alternatively, however, the operations depicted in those figures could as well be implemented by software, hardware, firmware, or a combination of these residing in one or more data processing systems with other architectures.

Figure 4:
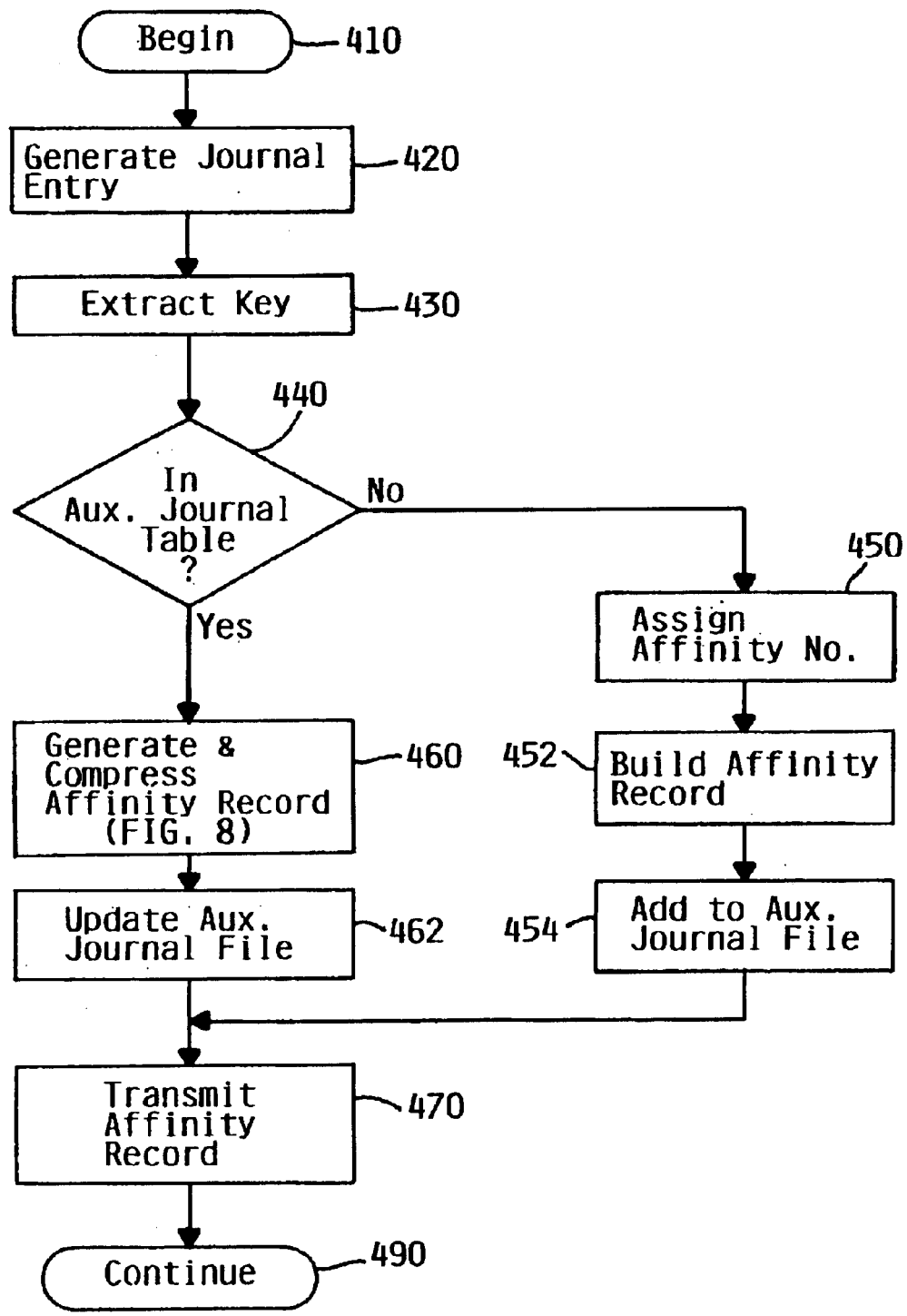
FIG. 4 is a high level logical flowchart depicting an exemplary process for generating compressed affinity records in accordance with the present invention.

The process of FIG. 4 begins at block 410 with an operator utilizing personnel application 212, and thus database engine 160, to modify data in personnel file 310. As described above and depicted at block 420, when such a modification is made, database engine 160 generates a journal record that is stored in journal file 320 and sent to mirror engine 170.

As illustrated at block 430, upon receipt of that journal record, mirror engine 170 extracts the following items from the journal record's header: the name of the file (or table) that was modified, the name of the directory (or library) that contains that file, and the length of the record that was modified. Then, as shown at block 440, mirror engine 170 determines whether auxiliary journal file 352 contains a previous journal record for the file that is named in the current journal record (i.e., personnel file 310). Mirror engine 170 does this by attempting to retrieve a record from auxiliary journal file 352, using the filename, directory name, and record length from the current journal record as a key.

If auxiliary journal file 352 does not contain such a record (as would be the case when the first record is added to personnel file 310 or when mirroring for personnel file 310 is first implemented), the process passes to block 450, which shows mirror engine 170 allocating a new affinity number to be used to identify journal records that describe updates to personnel file 310. In one implementation, that affinity number is simply the next unused row number (or relative record number) for auxiliary journal file 352. As described in detail below with reference to FIG. 6, mirror engine 170 then combines the affinity number with the current journal record to produce an affinity record, as depicted at block 452. The process then passes to block 454, which shows the current journal record being added to auxiliary journal file 352, for instance at the row corresponding to the allocated affinity number.

With reference again to block 440, if mirror engine 170 was able to retrieve the previous journal record, mirror engine 170 records the affinity number associated with the retrieved record (the relative record number of the retrieved record, for instance) and utilizes that affinity number, the current journal record, and the retrieved journal record to generate and compress an affinity record, as shown at block 460 (and as described in detail below with reference to FIG. 7 and FIG. 8). The process then passes to block 462, which illustrates mirror engine 170 modifying auxiliary journal file 352 by replacing the journal record that was retrieved therefrom with the current journal record.

Regardless of the outcome of the determination depicted at block 440, after the affinity record is generated, it is transmitted to remote data processing system 330, as depicted at block 470. The operator may then continue to utilize data processing system 100 (for instance, to make additional modifications to personnel file 310), as depicted at block 490.

Figure 5:
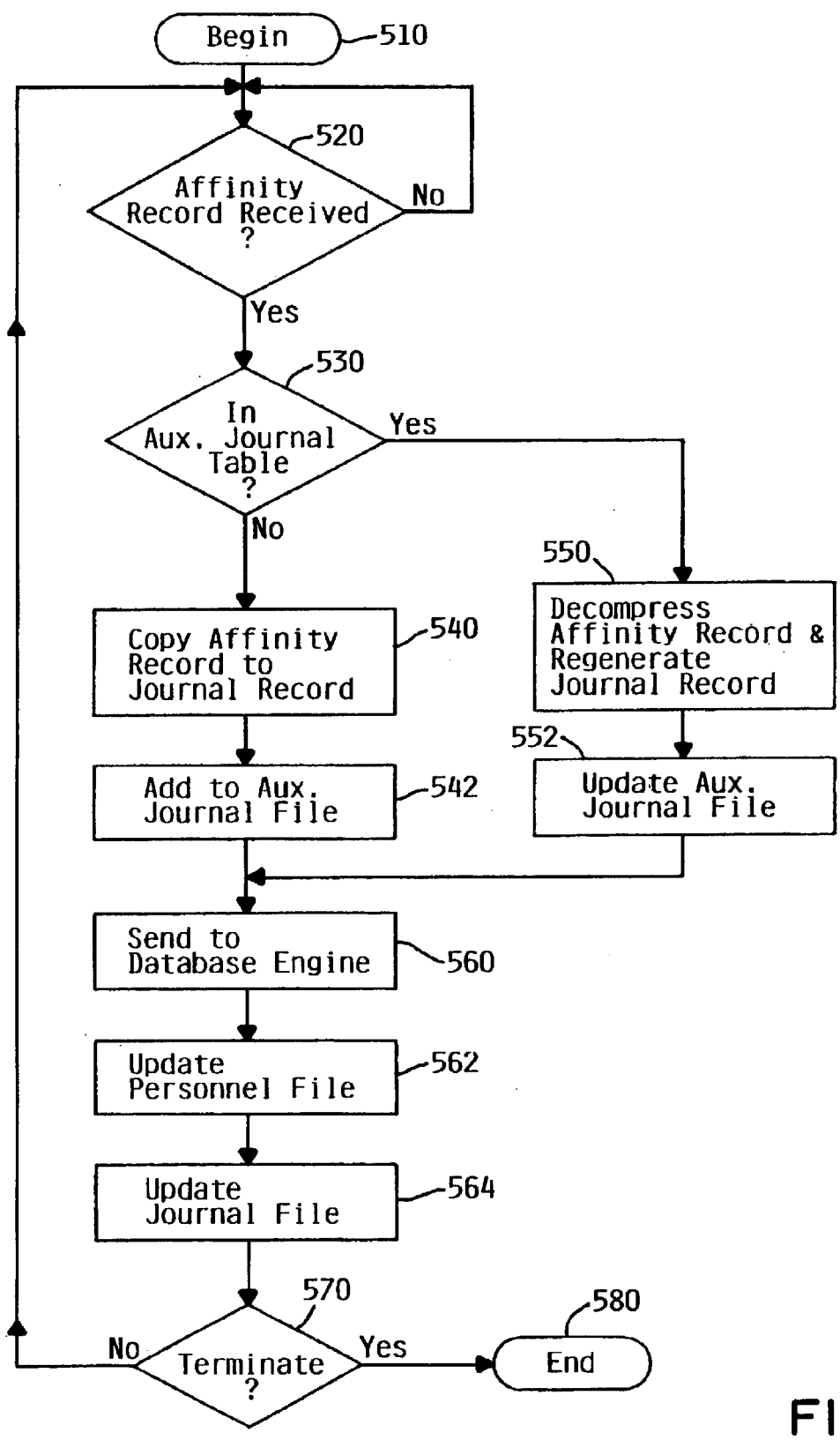
FIG. 5 is a high level logical flowchart depicting an exemplary process for utilizing affinity records to maintain a secondary data repository in accordance with the present invention.

Referring now to FIG. 5, there is illustrated a high level logical flowchart depicting an exemplary process, in accordance with the present invention, for utilizing affinity records to update a secondary data repository. The process begins at block 510 with remote mirror engine 370 and remote database engine 380 executing on remote data processing system 330. The process then passes to block 520, which illustrates remote mirror engine 370 determining whether a new affinity record has been received. If so, the process passes to block 530; otherwise, remote mirror engine 370 waits for such a record by repeatedly performing the determination depicted at block 520.

When the process passes to block 530, remote mirror engine 370 extracts the affinity number from the affinity record and attempts to retrieve a journal record corresponding to that number from remote auxiliary journal file 372. If remote mirror engine 370 finds no such record, no decompression is necessary, and remote mirror engine 370 regenerates the current journal record by copying the received affinity record, less the affinity number, as shown at block 540. The process then passes to block 542, which shows remote mirror engine 370 adding the current journal record to remote auxiliary journal file 372, in accordance with the affinity number (for instance, in the row whose row number matches the affinity number).

Referring again to block 530, if a journal record corresponding to the affinity number was retrieved from remote auxiliary journal file 372, as depicted at block 550 (and as described in detail below with reference to FIG. 7), remote mirror engine 370 decompresses the affinity record and then regenerates the current journal record, using the decompressed affinity record and the retrieved journal record. The process then passes to block 552, which shows remote mirror engine 370 replacing the retrieved journal record of remote auxiliary journal file 372 with the current journal record.

Regardless of the outcome of the determination depicted at block 530, after the current journal record has been regenerated, remote mirror engine 370 translates that journal record into a modification request, which is sent to remote database engine 380, as illustrated at block 560. In response, as depicted at block 562, remote database engine 380 modifies remote personnel file 360, thereby bringing that file into agreement with local personnel file 310. In addition, if local journal file 320 is also being mirrored, a journal record matching the current journal record is added to remote journal file 382, as depicted at block 564.

The process then passes to block 570, which illustrates a determination whether termination of mirroring has been requested. If it has, the process terminates at block 580; otherwise, the process return to block 520 to resume the processing of affinity records.

Figure 6A:
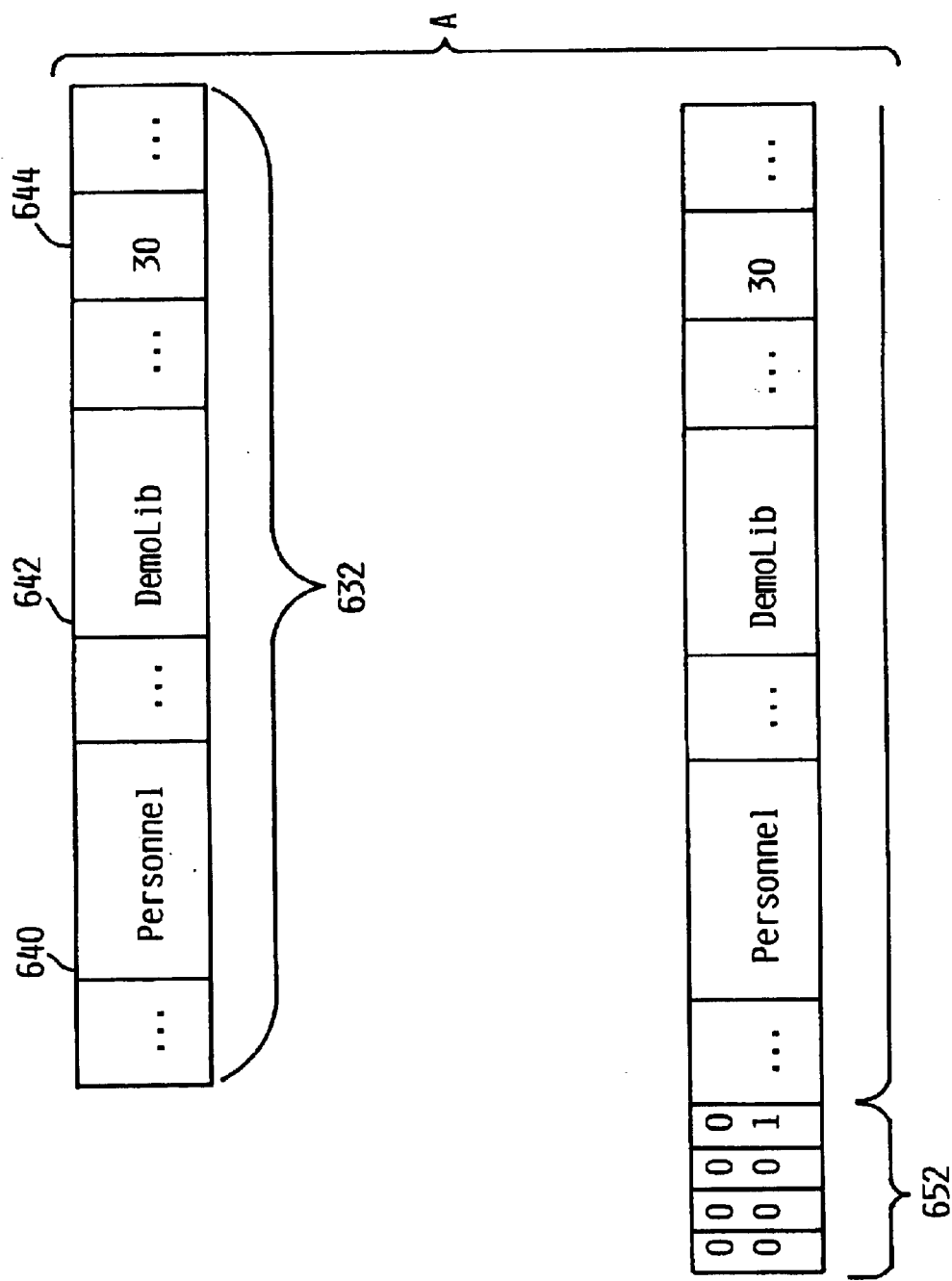
FIGS. 6 and 7 illustrate exemplary data structures utilized in the generation, compression, and decompression of affinity records in accordance with the present invention.
Figure 6B:
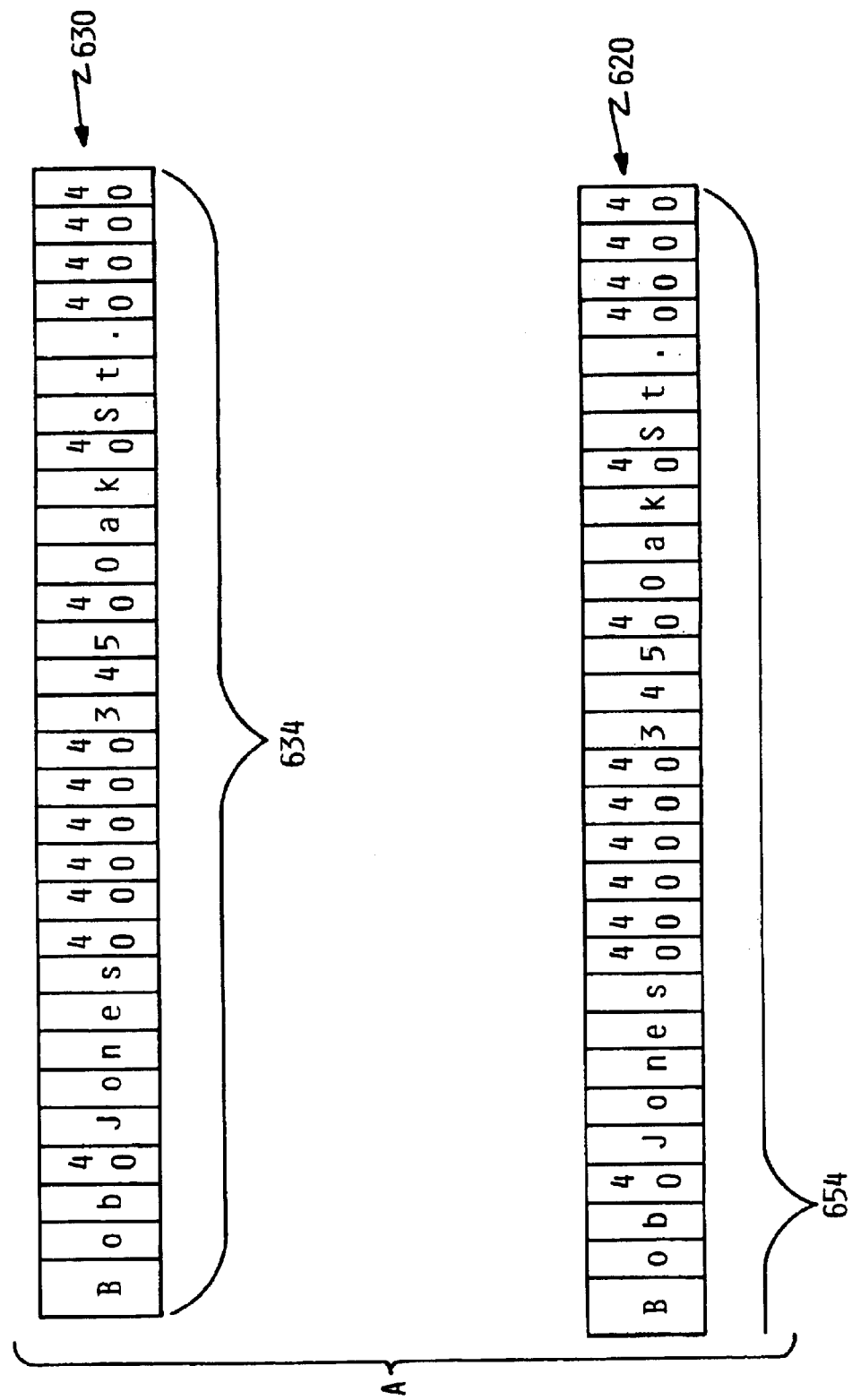

With reference now to FIG. 6, there are illustrated exemplary data structures utilized in the process of generating affinity records in accordance with the present invention. The data structures illustrated relate to a first exemplary process, in which a first affinity record 620 for personnel file 310 is generated, transmitted, and utilized, in response to the receipt of a journal record 630 that was generated when an operator added an initial record to personnel file 310.

Journal record 630 is composed of a header 632 and a body 634. The headers of all journal records have a common fixed length (such as 172 bytes). That length holds a sequence of fields containing information about the subject modification, including fields for journal record sequence number, journal record type, timestamp, user name, and program name. Header 632 also contains a filename (or object name) field 640, a library (or directory) name field 642, and a data-record length field 644. Body 634 generally contains a complete after-image of the modified data record. For example, journal record 630 depicts the record created in response to the addition of an initial personnel file record containing the name "Bob Jones" and the address "345 Oak St.", wherein personnel file 310 is designed to store 30-byte records, each composed of a 15-byte name field followed by a 15-byte address field.

Upon receiving journal record 630, mirror engine 170 attempts to retrieve a previous journal record for personnel file 310 from auxiliary journal file 352, using the data from filename field 640, library name field 642, and a data-record length field 644 as the key to auxiliary journal file 352. Since the first exemplary process involves the initial record to be added to personnel file 310, no such previous journal record will be found. Consequently, mirror engine 170 will allocate a new, unused affinity number for the current journal record (e.g., 1) and will then add the current journal record 630 to auxiliary journal file 352 in a manner that associates the added record with the new affinity number. For instance, the new affinity number could be stored in auxiliary journal file 352 along with journal record 630, or the new affinity number could be stored in an index table that links affinity numbers and auxiliary-journal-file relative record numbers. In the illustrative embodiment, however, mirror engine 170 simply utilizes the affinity number as the added record's relative record number.

After allocating the new affinity number, mirror engine 170 generates an affinity record 620 including an affinity number field 652 containing the new affinity number, followed by a trailer 654 containing the complete contents of journal record 630. Affinity record 620 is then transmitted to remote data processing system 330.

Upon receipt of that record, remote mirror engine 370 attempts to retrieve a previous journal record for personnel file 310 by searching remote auxiliary journal file 372 for a record with a relative record number that matches the affinity number from the received affinity record. In the current example, no such previous journal record will be found. Consequently, as described above with reference to FIG. 5, remote mirror engine 370 adds the data from trailer 654 to auxiliary journal file 372 and utilizes that data to generate a modification request for remote database engine 380 to bring remote personnel file 360 into agreement with local personnel file 310.

Figure 7A:
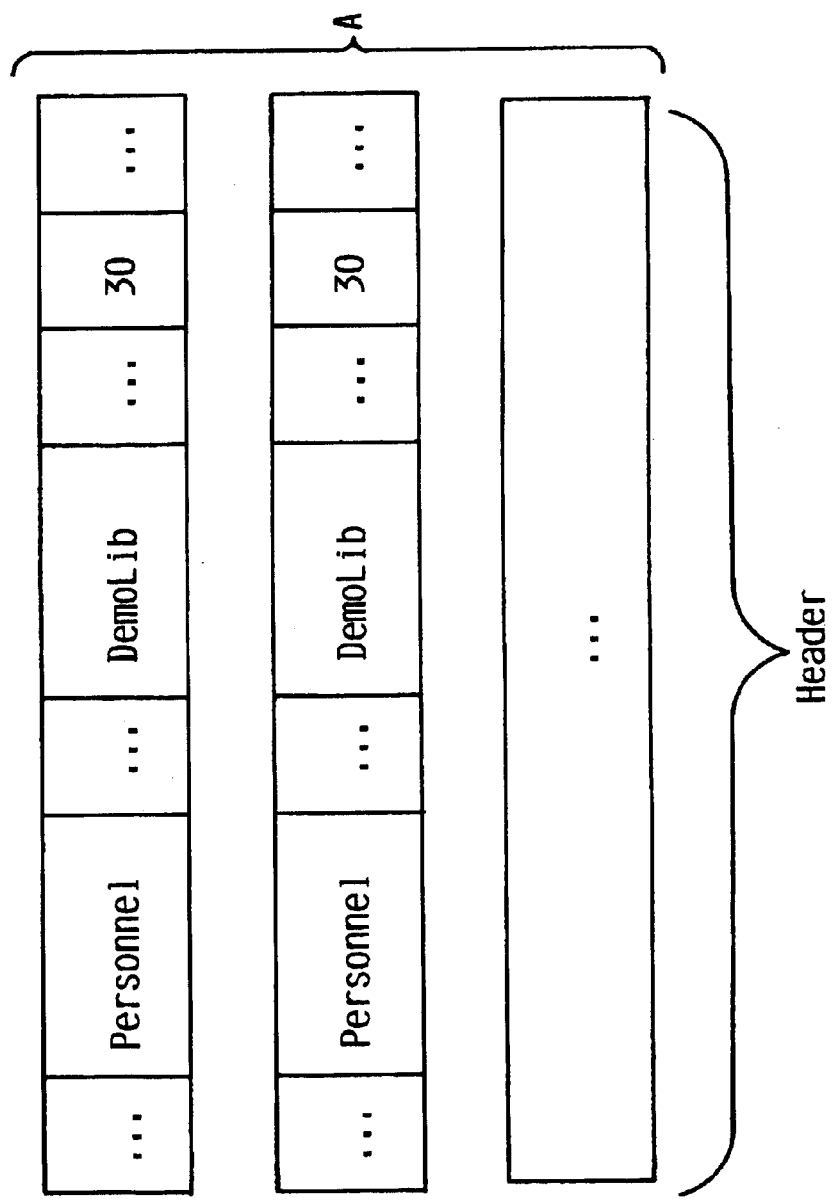
Figure 7B:
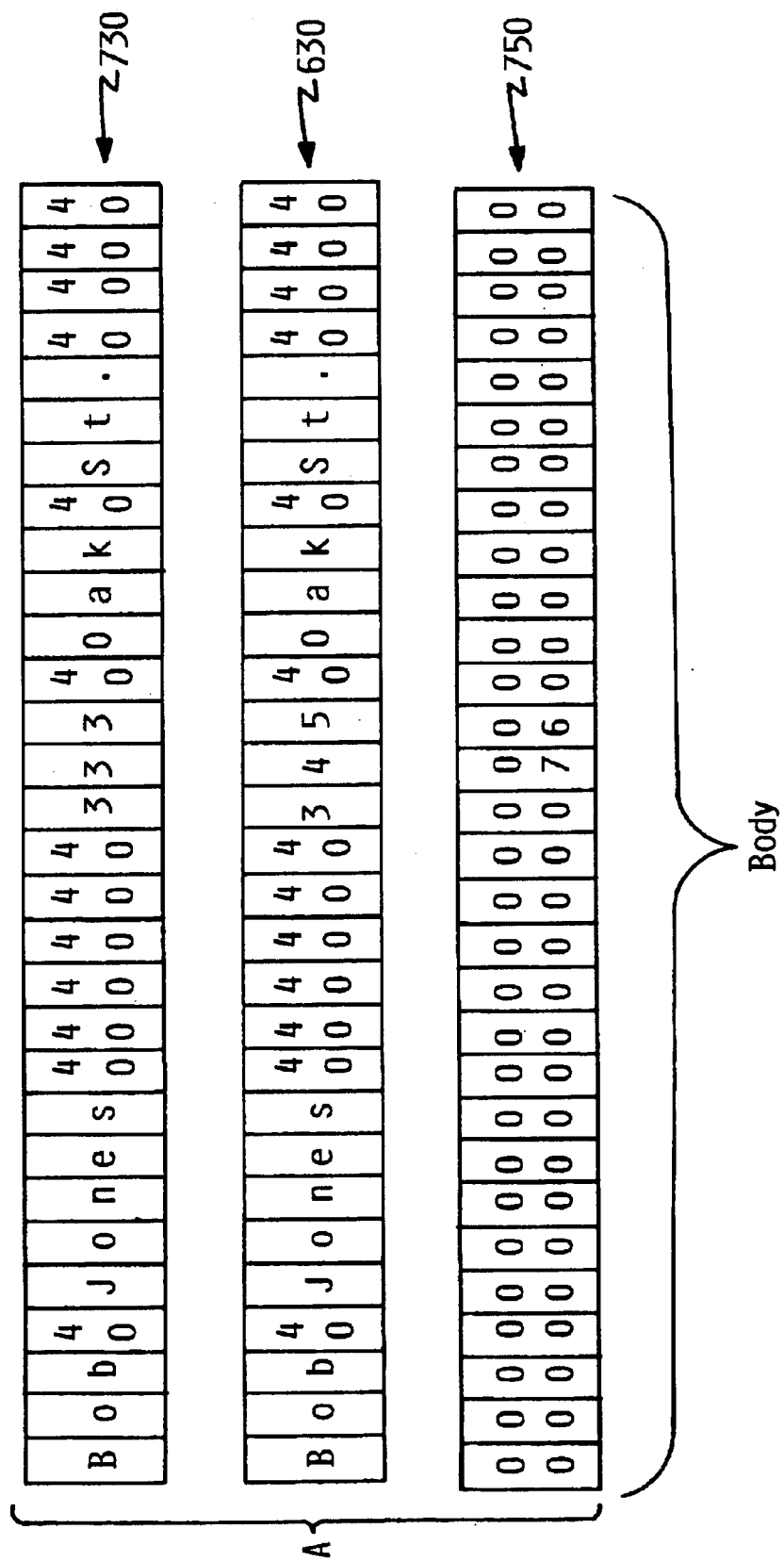
Figure 7C:
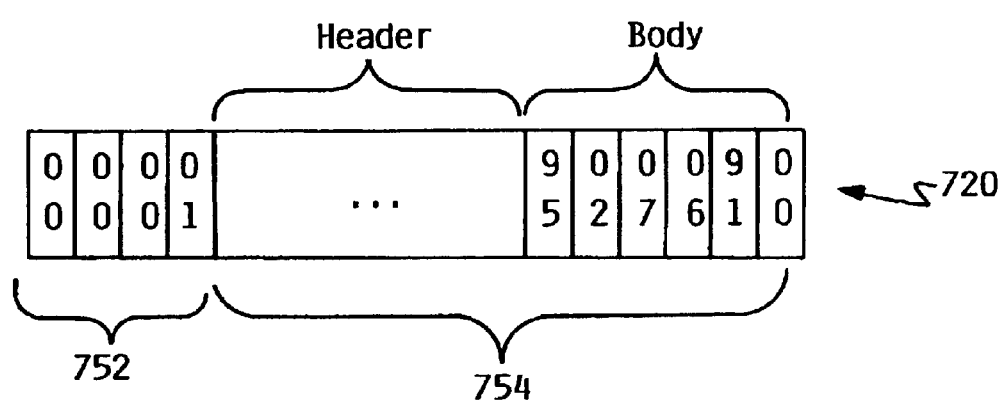
Figure 8:
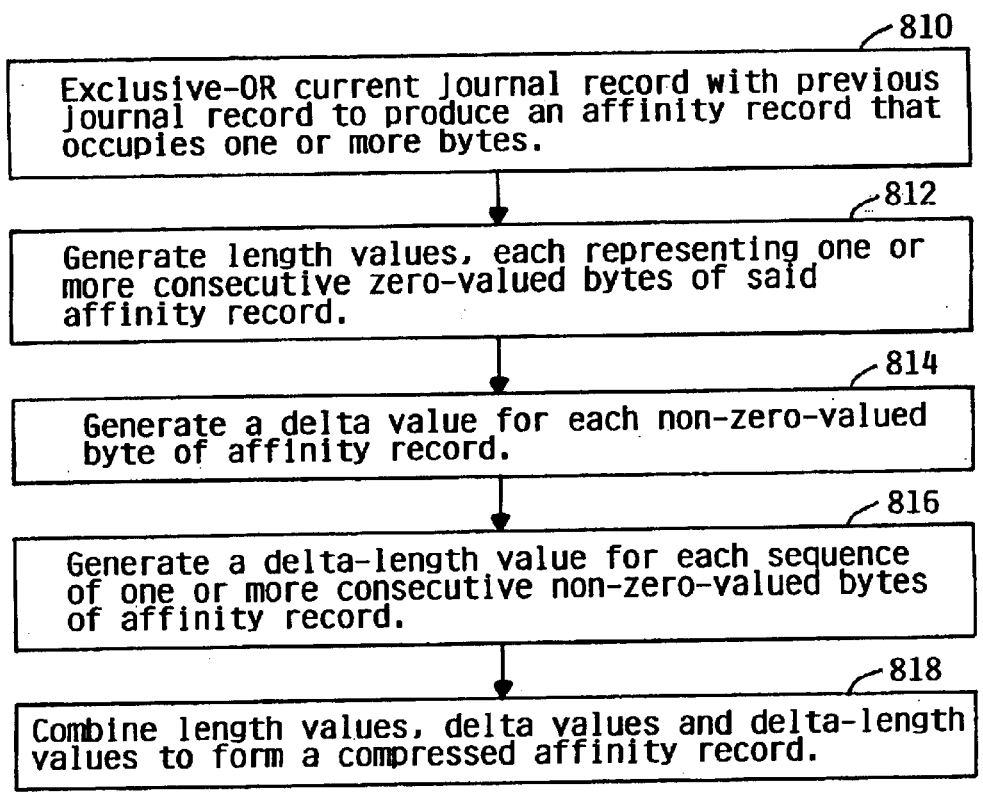
FIG. 8 is a logical flowchart depicting in greater detail an exemplary process for generating and compressing an affinity record in accordance with the present invention.

Referring now to FIG. 7, exemplary data structures utilized in a second exemplary process of producing and utilizing affinity records in accordance with the present invention are depicted. The second exemplary process involves the generation and utilization of a second affinity record 720 for personnel file 310, in response to the receipt of a current journal record 730 that was generated when an operator modified the address field of the record that was added to personnel file 310 in the first exemplary process from "345 Oak St." to "333 Oak St."

Upon receiving current journal record 730, mirror engine 170 attempts to retrieve a corresponding previous journal record from auxiliary journal file 352, as described above. In this second exemplary process, personnel file 310 has not been modified since the initial personnel record was added, so mirror engine 170 will retrieve journal record 630 (now "previous journal record 630"). Mirror engine 170 then notes the current affinity number (i.e., the affinity number that was associated with previous journal record 630), compares previous journal record 630 with current journal record 730, and creates affinity record 720 to encode the differences between the two journal records.

Mirror engine 170 performs that comparison by exclusive ORing each byte of current journal record 730 with each corresponding byte of previous journal record 630 (Step 810). In this second exemplary process, the data in the headers of those two records will be largely the same, with only slight differences in a few fields, such as the timestamp field. Likewise, the data in the bodies will be largely identical, the only difference being the two bytes of the address field that changed from "45" to "33." Consequently, as illustrated, the exclusive OR will produce a result 750 composed predominantly of zeros.

Mirror engine 170 then compresses result 750 by encoding each sequence of one or more zero-valued bytes (up to a length of 127 bytes) in a single byte (Step 812). The byte is assigned a high-order bit of one, and the length of the byte-string of zeros is stored in the remaining seven bits. In addition, wherever a sequence of one or more non-zero bytes occurs in result 750, mirror engine 170 inserts that sequence of non-zero bytes into a corresponding position of affinity record 720 (Step 814), prefacing each such sequence of non-zero bytes with a one-byte delta-length block (Step 816). The high-order bit of the one-byte delta-length block is set to zero, and the remaining bits are set to the length of the non-zero byte sequence. However, if any zero or non-zero byte sequence exceeds 127 bytes in length, that byte sequence is encoded as two or more consecutive sequences.

The result of the compression is then loaded into trailer 754, along with a terminating byte of hexadecimal (hex) 00 (Step 818). Also, the current affinity number is loaded into affinity number field 752. Thus, as shown, affinity number field 752 contains the value 1, and the portion of trailer 754 that corresponds to the body of the journal records contains the hex values 90, 02, 07, 06, 8C. Affinity record 720 is then transmitted to remote data processing system 330.

Upon receiving affinity record 720, remote mirror engine 370 utilizes the value from affinity number field 752 as a relative record number to retrieve previous journal record 630 from remote auxiliary journal file 372. Since that retrieval succeeds, remote mirror engine 370 then decompresses trailer 754 to reproduce result 750. For instance, when decompressing the portion of trailer 754 that corresponds to the body of the journal records, mirror engine performs the following conversions: Hex 90 (i.e., binary 1001 0000), having a high-order bit of 1, is converted to sixteen bytes of zeros. Then, hex 02, having a high-order bit of 0, is interpreted as the prefix of two non-zero bytes. Consequently, hex 07 and 06 are simply moved into result 750 without modification. Finally, hex 8C (i.e., binary 1000 1100) is converted to twelve bytes of zeros.

After reproducing result 750, remote mirror engine 370 exclusive ORs result 750 with previous journal record 630 to reproduce current journal record 730. Current journal record 730 is then converted into a modification request, which is sent to remote database engine 380 to bring remote personnel file 360 into agreement with local personnel file 310.

The present invention thus reduces the amount of data that must be transmitted to a remote site to keep mirrored data at the remote site current. As has been described, the present invention accomplishes this feat by storing the last journal record for each mirrored file in an auxiliary file and utilizing those journal records to compress newly received journal records into affinity records that encode the differences between successive journal records.

While the invention has been particularly shown and described with reference to an illustrative embodiment, it will be understood by those skilled in the art that various changes in form and detail may be made therein without departing from the spirit and scope of the invention. For example, although the comparison, compression, and record generation processes are described as being performed in sequence, they could as well be performed concurrently in sub-steps (e.g., by exclusive ORing and compressing corresponding bytes one pair at a time, with the results stored immediately in the record to be generated).

In addition, the compression techniques of the present invention are not limited in application to maintaining mirrored files. Those compression techniques also could be used to produce journal files that require less storage than conventional journal files. Smaller journal files could be produced by not storing the conventional journal records, which contain complete after-images, but converting those journal records into affinity records that encode (in compressed form) the differences between consecutive journal records. Likewise, the present invention could be utilized to encode data in a wide variety of other applications that store and process related blocks data (such as records in a file or table). For example, tables in relational databases often contain records with substantial similarity, and those records could be stored as affinity records. Also, Internet web pages often include sequences or pages of similar data, and those sequences or pages could be transmitted as affinity records. Affinity based compression could also be used to encode changes to a file such as a word processing document, and the resulting affinity records could then be utilized to "undo" the changes. Also, affinity based compression could be used in multimedia transmissions, such as video broadcasts, in conjunction with conventional video compression techniques, to further reduce bandwidth requirements. Furthermore, some or all of the operations of the present invention could be implemented in hardware, as described above, to expedite those operations.

In addition, it should be understood that the present invention is not limited to the particular architectures and environments described in the illustrative embodiment, but could as well be implemented on any of a range of systems that includes, without limitation, single-user, single-processor personal computers, as well as collaborative environments containing numerous multi-user, multi-processor computers.

Furthermore, although aspects of the present invention have been described with respect to a computer system executing software that directs the functions of the present invention, it should be understood that present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method in a data processing system for generating compressed affinity records, said method comprising:
    receiving first and second data records;
    exclusive ORing said second data record with said first data record to produce an affinity record that occupies one or more bytes;
    generating zero or more length values, each representing one or more consecutive zero-valued bytes of said affinity record;
    generating a delta value for each non-zero-valued byte of said affinity record;
    generating a delta-length value for each sequence of one or more consecutive non-zero-valued bytes of said affinity record; and
    combining said zero or more length values, each delta value, and each delta-length value to form a compressed affinity record having at least one of: a length value, a delta value, and a delta-length value.

2. The method of claim 1, wherein:
    each of said zero or more length values is stored in one byte and has a value of one as a high-order bit; and
    each delta value is stored in one byte and has a value of zero as a high-order bit.

3. The method of claim 1, wherein:
    said first and second data records are received by a first data processing system;
    said first and second data records are first and second journal records respectively describing first and second modifications of a first data file associated with said first data processing system; and
    said method further comprises transmitting said compressed affinity record to a second data processing system, such that said compressed affinity record may be utilized to cause a second data file associated with said second data processing system to be modified to agree with said first data file.

4. The method of claim 3 further comprising modifying said second data file by:
    receiving said first journal record and said compressed affinity record at said second data processing system;
    generating an uncompressed affinity record from said compressed affinity record;
    regenerating said second journal record by exclusive ORing each delta value of said uncompressed affinity record with a corresponding byte of said first journal record; and
    modifying said second file in accordance with said second journal record.

5. A program product for generating compressed affinity records, said program product comprising:
    instructions that, when executed:
        receive first and second data records;
        exclusive OR said second data record with said first data record to produce an affinity record that occupies one or more bytes;
        generate zero or more length values, each representing one or more consecutive zero-valued bytes of said affinity record;
        generate a delta value for each non-zero-valued byte of said affinity record;
        generate a delta-length value for each sequence of one or more consecutive non-zero-valued bytes of said affinity record;
        combine said zero or more length values, each delta value, and each delta-length value to form a compressed affinity record having at least one of: a length value, a delta value, and a delta-length value; and
    a computer usable medium encoding said instructions.

6. The program product of claim 5, wherein:
    said instructions store each of said zero or more length values in one byte and assign a value of one to a high-order bit of that byte; and
    said instructions store each delta value in one byte and assign a value of zero to a high-order bit of that byte.

7. The program product of claim 5, wherein:
    said instructions receive said first and second data records at a first data processing system;
    said first and second data records are first and second journal records respectively describing first and second modifications of a first data file associated with said first data processing system; and
    said instructions also transmit said compressed affinity record to a second data processing system, such that said compressed affinity record may be utilized to cause a second data file associated with said second data processing system to be modified to agree with said first data file.

8. The program product of claim 7 wherein said instructions modify said second data file by:
    receiving said first journal record and said compressed affinity record at said second data processing system;
    generating an uncompressed affinity record from said compressed affinity record;
    regenerating said second journal record by exclusive ORing each delta value of said uncompressed affinity record with a corresponding byte of said first journal record; and modifying said second file in accordance with said second journal record.

9. A data processing system that generates compressed affinity records, said data processing system comprising:

a storage area containing first and second data records; and a compressed-affinity-record generator in communication with said storage area for:

exclusive ORing said second data record with said first data record to produce an affinity record that occupies one or more bytes;

generating zero or more length values, each representing one or more consecutive zero-valued bytes of said affinity record;

generating a delta value for each non-zero-valued byte of said affinity record;

generating a delta-length value for each sequence of one or more consecutive non-zero-valued bytes of said affinity record; and combining said zero or more length values, each delta value, and each delta-length value to form a compressed affinity record having at least one of: a length value, a delta value, and a delta-length value.

10. The data processing system of claim 9, wherein:

said data processing system stores each of said zero or more length values in one byte and assigns a value of one to a high-order bit of that byte; and said data processing system stores each delta value in one byte and assigns a value of zero to a high-order bit of that byte.

11. A collaborative file management system, wherein:

said collaborative file management system comprises a first data processing system according to said data processing system of claim 9;

said first and second data records are first and second journal records respectively describing first and second modifications of a first data file associated with said first data processing system; and said compressed affinity record is transmitted said to a second data processing system, such that said compressed affinity record may be utilized to cause a second data file associated with said second data processing system to be modified to agree with said first data file.

12. The collaborative file management system of claim 11, wherein said second data processing system comprises a mirror engine that modifies said second data file by:

receiving said first journal record and said compressed affinity record;

generating an uncompressed affinity record from said compressed affinity record;

regenerating said second journal record by exclusive ORing each delta value of said uncompressed affinity record with a corresponding byte of said first journal record; and modifying said second file in accordance with said second journal record.

* * * * *